United States Patent
Hode

(10) Patent No.: US 7,965,210 B2
(45) Date of Patent: Jun. 21, 2011

(54) CONTROL CLOSED-LOOP DEVICE AND SIGMA-DELTA MODULATOR

(75) Inventor: Jean-Michel Hode, St Cloud (FR)

(73) Assignee: Thales (FR)

( * ) Notice: Subject to any disclaimer, the term of this patent is extended or adjusted under 35 U.S.C. 154(b) by 0 days.

(21) Appl. No.: 12/513,067

(22) PCT Filed: Oct. 26, 2007

(86) PCT No.: PCT/EP2007/061564
§ 371 (c)(1),
(2), (4) Date: Jul. 21, 2009

(87) PCT Pub. No.: WO2008/052948
PCT Pub. Date: May 8, 2008

(65) Prior Publication Data
US 2010/0060499 A1 Mar. 11, 2010

(30) Foreign Application Priority Data
Oct. 31, 2006 (FR) .................................... 06 09560

(51) Int. Cl.
*H03M 3/00* (2006.01)
(52) U.S. Cl. ...................................... 341/143; 341/155
(58) Field of Classification Search .......... 341/117–120, 341/143, 155
See application file for complete search history.

(56) References Cited

U.S. PATENT DOCUMENTS

| | | | | |
|---|---|---|---|---|
| 5,500,645 A * | 3/1996 | Ribner et al. | .................. | 341/143 |
| 5,623,263 A * | 4/1997 | Kuo et al. | ..................... | 341/143 |
| 5,889,482 A | 3/1999 | Zarubinsky et al. | | |
| 6,191,715 B1 * | 2/2001 | Fowers | .......................... | 341/120 |
| 6,271,781 B1 * | 8/2001 | Pellon | ............................ | 341/143 |
| 6,940,436 B2 * | 9/2005 | Hezar et al. | ................... | 341/143 |
| 2006/0158359 A1 | 7/2006 | Magrath | | |

OTHER PUBLICATIONS

Le, et al, 2002. "An Adaptive Analog Noise-Predictive Decision-Feedback Equalizer." IEEE Journal of Solid-State Circuits 37 (2): 105-113.

Pickering, et al, 2004. "Design of a quantum-based oversampling delta-signma analogue-to-digital converter for metrology applications." IEE Proc. Sci. Meas. Technol. 151(5): 362-367.

* cited by examiner

*Primary Examiner* — Jean B Jeanglaude
(74) *Attorney, Agent, or Firm* — Stroock & Stroock & Lavan LLP

(57) ABSTRACT

A closed loop slaving device is provided for slaving a first component, the slaving device including a second component having a multiplicative noise. A compensation noise is added to the input signal of the slaving device, the compensation noise being substantially equal to the input signal of the slaving device multiplied by the multiplicative noise of the second component. A sigma-delta modulator is also provided to convert an analog input signal into a digital output signal by use of an analog-to-digital converter slaved in the closed loop slaving device.

7 Claims, 4 Drawing Sheets

CONTROL CLOSED-LOOP DEVICE AND SIGMA-DELTA MODULATOR

Figure 2A:
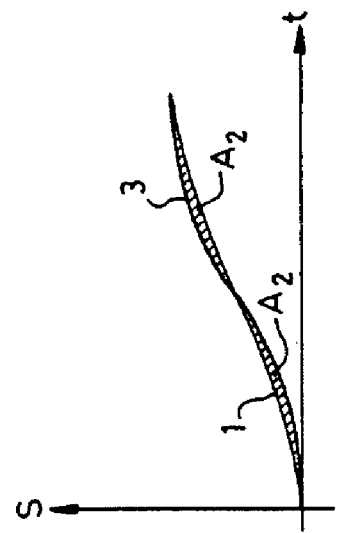

This is a U.S. National Phase Application under 35 U.S.C. §371 of International Application No. PCT/EP2007/061564, filed Oct. 26, 2007, and claims benefit of French Patent Application No. 06 09560, filed Oct. 31, 2006, both of which are incorporated herein. The International Application was published in French on May 8, 2008 as WO 2008/052948 under PCT Article 21 (2).

The present invention relates to a device for slaving a first component in a closed loop, comprising in the return circuit to the loop input a second component having a noise factor. It also relates to a sigma-delta modulator making it possible to convert an analog input signal into a digital output signal and using this closed loop slaving device. It applies for example in the field of microwave frequency electronics.

The conversion of an analog signal into a digital signal has become a conventional operation in contemporary electronic circuits, by virtue of standard off-the-shelf components commonly lumped together under the acronym ADC standing for "Analog-to-Digital Converter". This involves representing a signal e(t) which varies in a continuous manner over time and can take any value in a form s(t) sampled over time. Each sample can take a finite number of possible quantized values and each value is coded on a well determined number of bits. Each bit can take only two possible values, 1 or −1 for example.

Conventional ADCs offer performance ratings in terms of precision which are sufficient at relatively low frequencies of the input signal, of the order of a few megahertz. This implies that at these frequencies, the difference between the signal represented digitally at output and the analog input signal is acceptable. But in the microwave frequency domain, when the frequency of the input signal is of the order of several gigahertz, the dynamics of conventional ADCs, that is to say their capacity to rapidly sample/quantize the input signal, turns out to be markedly insufficient. This is mainly due to a phenomenon of remanence on an internal component of the ADCs called a sample-and-hold unit. It is hard for a sample-and-hold unit to stabilize an input signal with a view to quantizing it if it is at too high a frequency: the duration of stabilization becomes too short and the amplitudes between the samples to be stabilized too high. This introduces errors, that is to say digital samples may not be representative of the analog signal. Thus, at high frequency the difference between the signal represented digitally at output and the analog signal at input becomes non-negligible and the precision of the ADC is no longer sufficient. To summarize, the precision of conventional ADCs decreases when the frequency of the analog signal e(t) applied to their input increases. They are therefore not suitable for use in applications at very high frequencies demanding good digital precision, such as radars for example.

A method called sigma delta ("$\Sigma\Delta$") modulation makes it possible to improve the precision of an ADC locally around a frequency, optionally around a high frequency. The basic idea is to arbitrarily vary the digital output signal, or to "modulate" it, so as to minimize the error in the power, even if by so doing, samples of the digital output signal may seem unrepresentative of the analog input signal. For this purpose, $\Sigma\Delta$ modulation relies notably on a principle of over-sampling of the input signal on a small number of bits. This involves on the one hand increasing the temporal precision by splitting the signal into a large number of very brief samples. Moreover, it involves decreasing the precision in terms of amplitude since, for each sample, only few distinct values of amplitude are coded, using few bits. Intrinsically, this generates an error due to the lack of precision in the quantization of the amplitude of each sample. Consequently, the error inherent in any method of digitization and improperly called "quantization noise" is significant. But by relying on over-sampling, the digital output signal is modulated as explained previously, thereby making it possible to minimize the power of this quantization noise in a determined frequency band.

In the frequency domain or spectral domain, it is commonly said that the $\Sigma\Delta$ modulation "conforms" the quantization noise. Specifically, the modulation of the digital output signal, which is suited to the frequency of the input signal, amounts to minimizing the power of the quantization noise around this frequency, or else to decreasing the spectral density of the quantization noise around the useful signal. In fact, the spectrum of the quantization noise should be made to "conform" to an ideal spectrum exhibiting a trough in the neighborhood of the frequency of use. Thus, even if significant quantization noise is intrinsically generated by $\Sigma\Delta$ modulation, whatever the frequency of the signal at input, at least this quantization noise is of low power in the neighborhood of the frequency of use. In practice and as explained subsequently, a $\Sigma\Delta$ modulator is obtained by "compressing" the noise at the frequency of use.

A $\Sigma\Delta$ modulator can be implemented on the basis of an ADC slaved in a slaving loop in a conventional manner, with a view to attenuating the influence of its quantization noise on its digital output. In this case, a digital-to-analog converter, called a DAC subsequently, makes it possible to re-convert into analog the digital output signal from the ADC with a view to subtracting it from the input signal through the principle of the closed slaving loop. An amplifier and a filter in the loop make it possible to circumvent the drawback of conventional ADCs: they make it possible to associate high frequency and fine resolution. As detailed subsequently, the architecture of such a circuit is quite remarkable, since it applies conventional layout principles to very specific components, the individual behavior of the components always being complementary to the layout principles. This allows the whole system to converge in a rather more natural manner to the sought-after aim. The system is now limited only by the self-noise of the DAC. However, at equal frequency, it is easier to limit the noise of a DAC than to limit the noise of an ADC, and therefore the system is limited by the performance of its most adjustable component. In this sense also, the architecture of such a circuit is quite remarkable.

However, the self-noise of the DAC decomposes into two distinct and unequally controllable contributions: amplitude noise of static origin and dynamic noise.

A DAC comprises a certain number of identical current sources that can be switched to one or the other of two load resistors as a function of the digital signal applied to the input of the DAC. These sources possess a common voltage reference and low dispersions so that the DAC has the best possible linearity. The switched sources are thus summed in one or the other of the two load resistors as a function of the digital signal. The voltage deviation between the two load resistors, termed the "differential voltage", constitutes the analog output signal.

The dynamic noise is caused by small noise pulses generated at each switching in a time interval during which the two arms of the switches which change state are conducting. During this short time span, which is all the shorter the quicker the switches switch, the noise of the voltages for controlling the switches is greatly amplified. A priori, this noise is not correlated, therefore it adds up in terms of power. The total power of the dynamic noise is on the one hand proportional to the sampling frequency and on the other hand proportional to the number of switches changing state at each sampling instant. Consequently the total power of the dynamic noise is proportional to the frequency of the signal.

The static noise is for its part related to the voltage reference common to all the switchable current sources supplying the DAC. This common voltage possesses its own noise which is passed on proportionately to each current source, the corresponding noise current being proportional to the noise voltage of the common voltage reference. A current polluted by noise proportional to the current received by the resistors is obtained at the output of each of the two load resistors, so that the differential voltage is itself marred by noise proportional to the signal. According to its level which is related to the quality of the voltage reference, this multiplicative noise may become a limitation as regards the performance of the ΣΔ modulator.

Specifically and as detailed subsequently, the multiplicative noise of the DAC, in view of its position in the circuit, lies by summation directly on the input signal, without any compression.

Contemporary ΣΔ modulators put up with the amplitude noise of the DAC, notably by endeavoring to have excellent quality of the voltage reference. But this is not always possible and above all, this does not cancel the phenomenon completely.

The aim of the invention is notably to alleviate the aforesaid drawback by compressing the multiplicative noise generated by the DAC situated in the return circuit to the loop input in the same proportions as the closed slaving loop compresses the quantization noise of the ADC. For this purpose, the subject of the invention is a closed loop device for slaving a first component, a second component in the return circuit to the loop input having a multiplicative noise. A compensation noise is added to the input signal of the slaving loop, the compensation noise being substantially equal to the input signal of the slaving loop multiplied by the multiplicative noise of the second component.

Advantageously, the compensation noise added can be dependent on the reference voltage of the current source which supplies the second component, the multiplicative noise of the second component being dependent on this voltage.

The compensation noise can be generated by a differential amplifier receiving as input the input voltage of the slaving loop and whose reference voltage is that of the current which supplies the second component.

The subject of the invention is also a sigma-delta modulator making it possible to convert an analog input signal into a digital output signal on the basis of an analog-to-digital converter, the analog input signal being amplified by a high factor on input to the analog-to-digital converter and the digital output signal being subtracted from the input signal after conversion by a digital-to-analog converter having a multiplicative noise. A compensation noise is added to the input signal of the modulator, the compensation noise being substantially equal to the input signal of the modulator multiplied by the multiplicative noise of the digital-to-analog converter.

Advantageously, the input signal and the compensation noise can be injected into the modulator by use of an analog summator.

The compensation noise can be generated by a differential amplifier receiving as input the input signal of the modulator and whose reference voltage is that of the current which supplies the digital-to-analog converter.

In a particular embodiment, the input signal and the compensation noise can be injected into the modulator by summation of the currents of the differential amplifier in the branches of a cascode of the digital-to-analog converter.

One or more embodiments of the invention have the main advantage that it can be implemented in an elementary manner and at minimum cost, requiring only the addition of standard components for summing at the input of the modulator a current obtained on the basis of a voltage already available elsewhere.

Figure 1A:
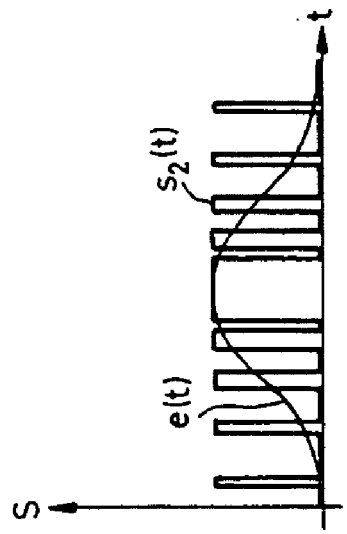
Figure 1B:
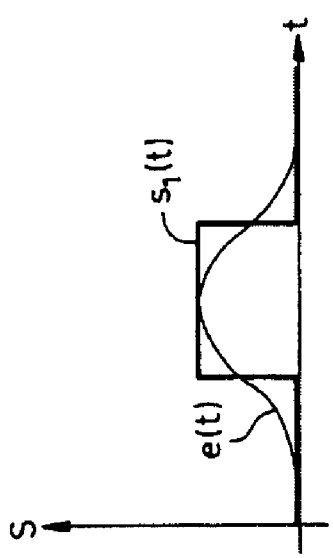
Figure 3A:
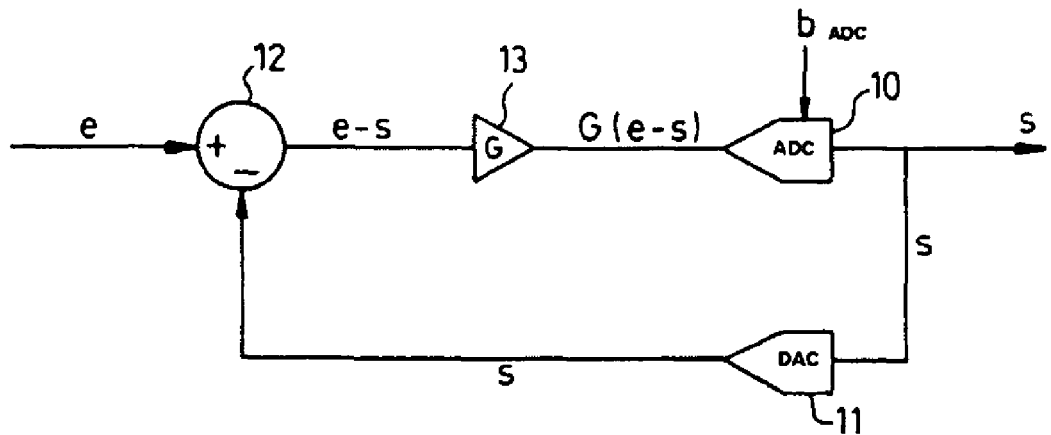
Figure 3B:
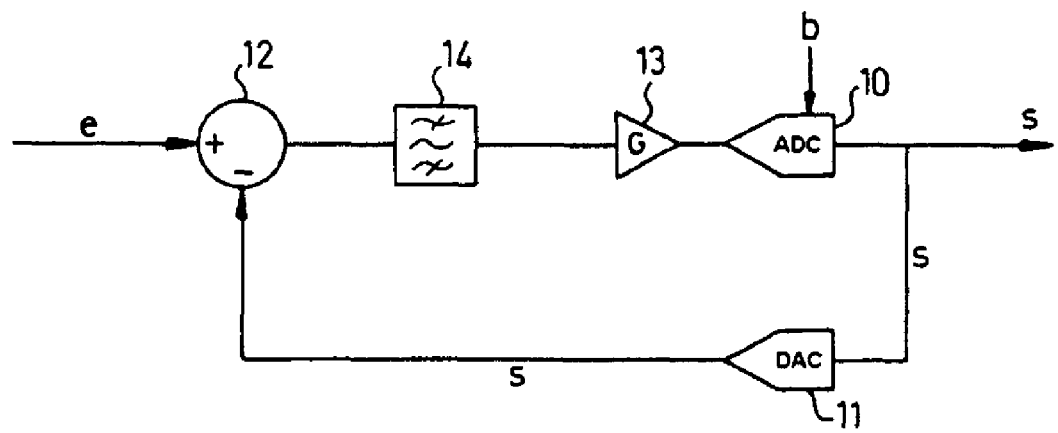
Figure 4:
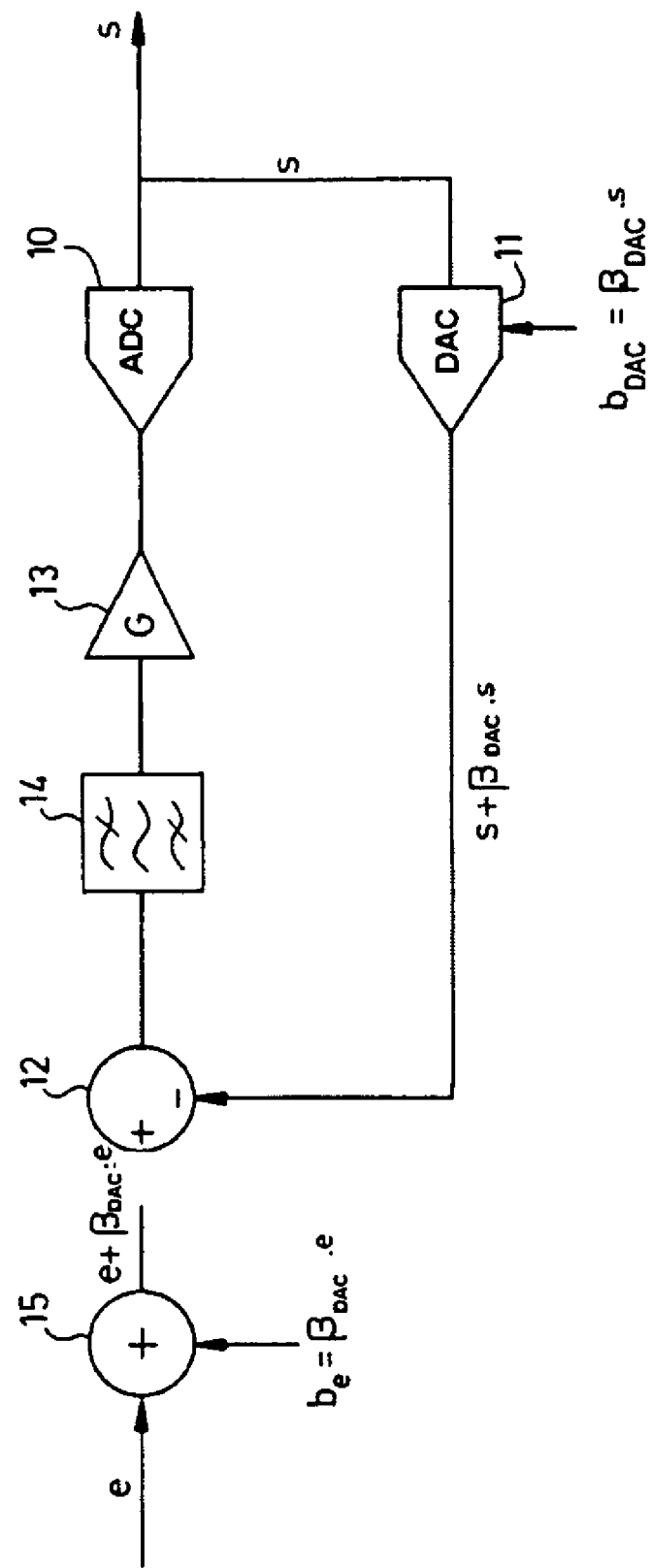
Figure 5:
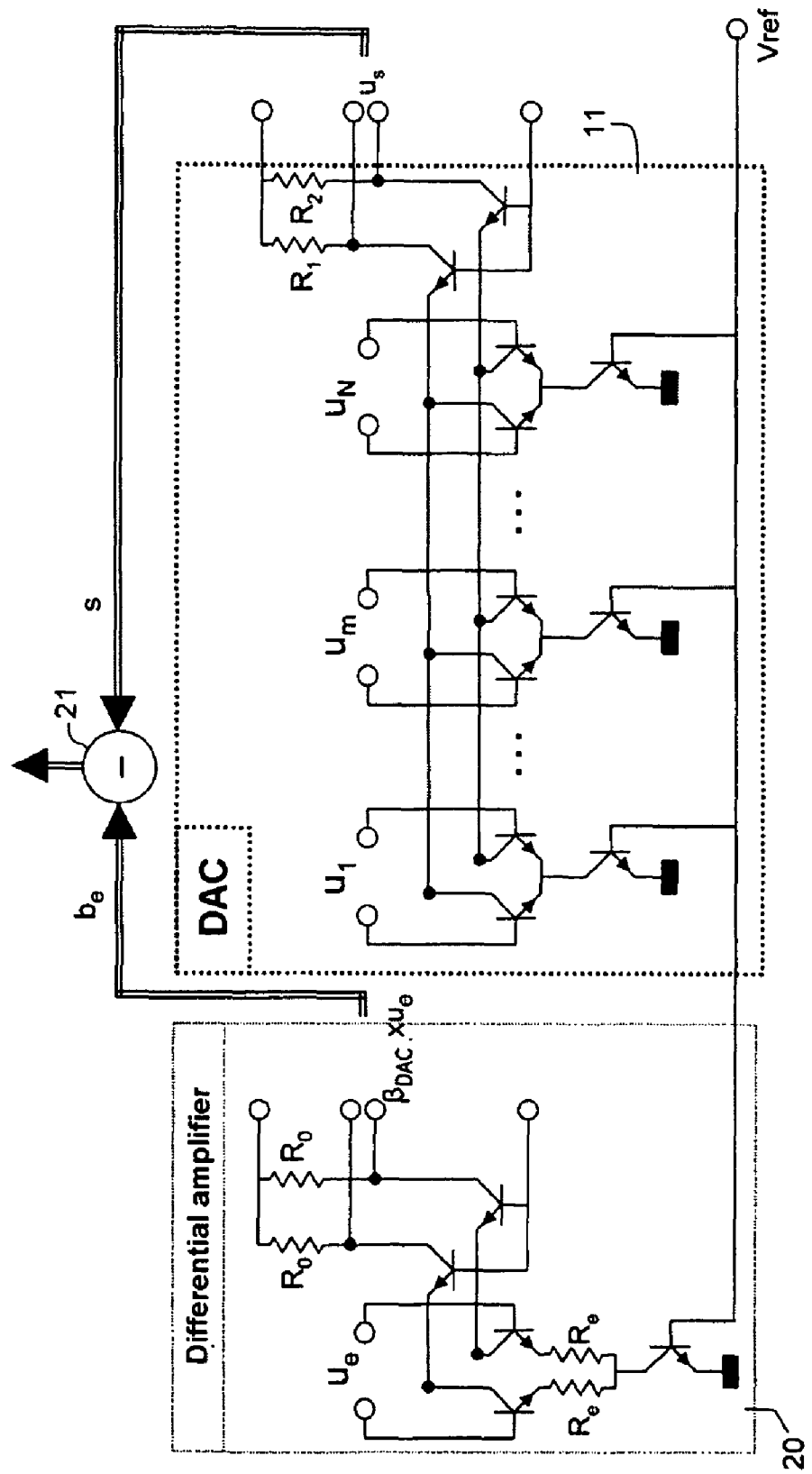

Other characteristics and advantages of one or more embodiments of the invention will become apparent with the aid of the description which follows offered in relation to appended drawings which represent:

FIGS. 1$a$, 1$b$, 2$a$ and 2$b$, by graphs an illustration of the principle of ΣΔ modulation, FIGS. 3$a$ and 3$b$, by schematics an exemplary embodiment of a ΣΔ modulator, FIG. 4, by a schematic an illustration of the principle of the closed slaving loop according to an embodiment of the invention in a ΣΔ modulator, FIG. 5, by a schematic an exemplary estimation of the compensation noise in a ΣΔ modulator according to an embodiment of the invention.

FIGS. 1$a$, 1$b$, 2$a$ and 2$b$, illustrate by graphs the principle of ΣΔ modulation in the case of single-bit baseband operation.

As illustrated by FIG. 1$a$, an analog signal e(t) can be converted into a digital signal $s_1$(t) on 1 bit at low sampling frequency. FIG. 1$b$ then illustrates the error made in the power of the signal by an area $A_1$ situated between the integral of e(t) represented by a curve 1 and the integral of $s_1$(t) represented by a curve 2.

Figure 2B:
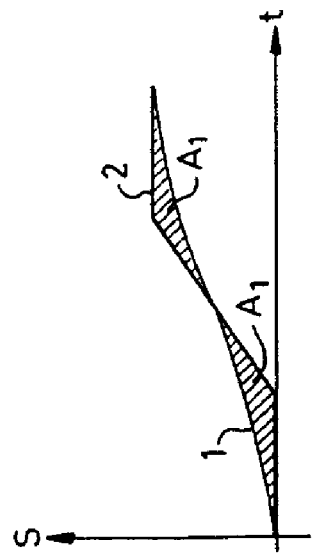

Likewise and as illustrated by FIG. 2$a$, the analog signal e(t) can also be converted into a digital signal $s_2$(t), still on 1 bit but at higher sampling frequency. The digital signal $s_2$(t) exhibits arbitrary variations or "modulations", that is to say samples which may seem unrepresentative of the analog input signal e(t). However, FIG. 2$b$ illustrates the error made in the power of the signal by an area $A_2$ situated between the integral of e(t) represented by the curve 1 and the integral of $s_2$(t) represented by a curve 3.

It is clearly apparent that the error $A_2$ made in terms of power by approximating e(t) by the modulated signal $s_2$(t) is lower than the error $A_1$ made in terms of power by approximating e(t) by the unmodulated signal $s_1$(t). This is what makes it possible to minimize the power of the quantization noise.

FIGS. 3$a$ and 3$b$ illustrate by schematics an exemplary embodiment of a ΣΔ modulator.

As illustrated by FIG. 3$a$, a ΣΔ modulator can be implemented on the basis of an ADC 10 slaved in a closed loop in a conventional manner. The ADC 10 is disposed in a closed slaving loop with a view to attenuating the influence of its quantization noise $b_{ADC}$ on its digital output s as a function of an analog input signal e to be converted. The closed slaving loop comprises a summator 12 taking e and s as input and whose role in the loop is to carry out the subtraction operation e−s (Δ operation of the modulator) through the principle of the closed slaving loop. The circuit portion between the output of the ΣΔ modulator and the input of the summator 12 which makes it possible to send s to the summator 12 is commonly called the "loop return". In the particular case of FIG. 3$a$, the loop return comprises in addition a digital-to-analog converter 11, which will be called the loop return DAC subsequently, which makes it possible to re-convert into analog the digital signal s output by the ADC 10 with a view to subtracting it from the input signal e through the principle of the closed slaving loop. An amplifier 13 of high gain G thereafter amplifies e−s. The role of the amplifier 13 in the loop is to "compress" the noise $b_{ADC}$ through the principle of the closed slaving loop. Specifically, if the signal e were applied directly to the input of the ADC 10, that is to say if the ADC 10 was not slaved in a closed loop, then the signal s at the output of the ADC 10 would be $s=e+b_{ADC}$ and the signal-to-noise ratio would be equal to $$\frac{e}{b_{ADC}}.$$

Whereas if the ADC 10 is slaved in a closed loop as illustrated by FIG. 3a, it is easily shown that the signal s at the output of the ADC 10 and the associated signal-to-noise ratio (SNR) are given by the following relations (1) and (2):

$$s = \frac{b_{ADC}}{1+G} + \frac{G}{1+G}e \quad (1)$$

$$SNR = G \times \frac{e}{b_{ADC}} \quad (2)$$

Now, G is high through the principle of the closed slaving loop, therefore $$\frac{1}{1+G} \approx 0 \text{ and } \frac{G}{1+G} \approx 1.$$

Thus s≈e and the signal-to-noise ratio is improved by a high factor G. In this, the amplifier 13 of high gain G "compresses" by a factor $$\frac{1}{1+G}$$

the quantization noise $b_{ADC}$ induced by the ADC 10.

A closed slaving loop is a generic layout in electronics for compressing the noise of a component. In the example of FIG. 3a, a slaving loop is applied to the ADC 10 to compress its quantization noise $b_{ADC}$. Only the loop return DAC 11 is a specific feature which is not given by the principle of the closed slaving loop. It makes it possible to return s to the same mode of analog representation as the signal e and thus enables e−s to be calculated.

A major drawback of the circuit of FIG. 3a slaving the ADC 10 is the temporal delay of the signal s over the signal e. This delay is inherent to the closed slaving loop principle. Its application to an ADC can constitute a serious problem of stability through an effect comparable with the Larsen effect, since the two operations of converting from analog to digital and then from digital to analog are particularly expensive in terms of time. More precisely, a study of the stability of ΣΔ modulators conducted by Thales has shown that the product G×B×T, where B is the band of the modulator and T the delay of the loop, cannot exceed a certain value dependent on the stiffness of the frequency response of the modulator.

To obtain a stable loop and as illustrated by FIG. 3b, a filtering component 14 with minimum phase variation is inserted between the summator 12 and the amplifier 13 and carries out an integration operation (Σ operation of the modulator). The component 14 which filters the high frequencies outside of the useful band targeted by the ΣΔ modulator is made in such a way that the global frequency response (in terms of amplitude and phase) of the loop complies with the Nyquist stability criterion. It should be noted that filtering in a ΣΔ modulator forms the subject of a patent filed by Thales.

Thus, the amplifier 13 and the filter 14 in the feedback loop of FIG. 3b make it possible by combination to circumvent the drawback of conventional ADCs: they make it possible to associate high frequency and fine resolution. The amplifier 13 compresses the quantization noise, and therefore decreases the error and increases the precision. The filter 14 makes it possible to increase the frequency by preventing the loop from diverging.

The architecture of the circuit of FIG. 3b is quite remarkable, since it applies conventional layout principles to very specific components, the individual behavior of the components always being complementary to the layout principles. This allows the whole system to converge in a rather more natural manner to the sought-after aim.

FIG. 4 illustrates the principle of the closed slaving loop according to an embodiment of the invention in a ΣΔ modulator on the basis of the same exemplary circuit as that of FIG. 3b. For example, the ADC 10, the DAC 11, the summator 12 and the amplifier 13 are assembled in a closed slaving loop. The filter 14 advantageously makes it possible to filter the high frequencies, the noise for example, and thus to produce a ΣΔ modulator. The analog signal e is applied to the input of the modulator, the digital signal s is found at the output of the modulator and is applied to the input of the loop return DAC 11.

The amplitude noise of the loop return DAC 11 is given by $b_{DAC}=\beta_{DAC} s$, where $\beta_{DAC}$ expresses the multiplicative noise introduced by the DAC. The multiplicative noise $\beta_{DAC}$ is specific to the current source and to the reference voltage used to supply the DAC 11. In the same manner as for relation (1), it is easily shown that in reality s is given by the following relation (3):

$$s = \frac{G}{1+G}e + \frac{b_{ADC}}{1+G} - \frac{G}{1+G}\beta_{DAC}s \quad (3)$$

Thus, even if the quantization noise $b_{DAC}$ introduced by the ADC 10 is indeed compressed by the loop by a factor $$\frac{1}{1+G} \approx 0,$$

such is not the case for the noise introduced by the DAC 11 since $$\frac{G}{1+G} \approx 1,$$

An embodiment of the invention proposes for example to add a summator 15 at the input of the ΣΔ modulator. It makes it possible to add a noise component $b_a=B_{DAC} e$ termed the "compensation noise" to the input signal e. To generate the compensation noise $b_e$ at the input of the modulator, it is necessary for example to use the same reference voltage as that used to supply current to the DAC 11. Then, it is easily shown that s is given by the following relation (4):

$$s = \frac{G}{1+G}e + \frac{b_{ADC}}{1+G} + \frac{G}{1+G}\beta_{DAC} \cdot (e-s) \quad (4)$$

As $$s \approx \frac{G}{1+G}e$$

by the principle of slaving, it follows that:

$$s = \frac{G}{1+G}e + \frac{b_{ADC}}{1+G} - \frac{G}{1+G}\frac{\beta_{DAC}e}{1+G} \quad (5)$$

This time, the noise introduced by the DAC 11 is compressed by a factor $$\frac{G}{(1+G)^2}$$

of the same order of magnitude as the factor $$\frac{1}{1+G}$$

by which the noise $b_{ADC}$ of the ADC 10 is compressed. Thus, the noise of the ADC and the noise of the DAC are compressed in the same proportions, but by different to means: the noise of the ADC is compressed conventionally by the loop, whereas the noise of the DAC is compressed by virtue of the device according to an embodiment of the invention by adding the compensation noise to the input signal.

FIG. 5 illustrates an example of estimating the compensation noise in a ΣΔ modulator according to an embodiment of the invention on the basis of the same DAC 11 as FIGS. 3a, 3b and 4. This essentially involves generating the compensation noise $b_e$ from the multiplicative noise $\Theta_{DAC}$ of the DAC 11 and adding it to the input signal e.

Advantageously, a differential amplifier 20 uses the same reference voltage $V_{ref}$ as the current sources supplying the DAC 11. The differential amplifier 20 receives as input the signal e, characterized by the input voltage $u_e$. Through the principles of the differential amplifier that are known elsewhere and by adjusting the differential pairs of the amplifier with resistors $R_0$ and $R_e$ satisfying $R_e=R_0/g$ (where g is the voltage gain of the amplifier), the output current of the amplifier 20 is proportional to the input signal and is characterized by the output voltage $g \times u_e$ and the added noise $\beta_{DAC} \times g \times u_e$. The output signal from the amplifier 20 can thus contain the compensation noise $b_e$.

The digital signal at the input of the DAC 11 is characterized by the voltages $u_1, \ldots, u_m, \ldots, u_N$. The analog signal s at the output of the DAC 11 is characterized by $u_s$. s is obtained through the difference of the voltages between the two equal load resistors $R_1$ and $R_2$, which themselves contain sums of source signals as a function of the switchings.

It is very important that the current source of the differential input amplifier be as close as possible to the sum of the current sources of the DAC, so that its multiplicative noise given as being equal to $\beta_{DAC}$ is actually as close as possible to this value.

For example, a component 21 effecting a difference receives as input the amplified input signal and the compensation noise $b_e$ originating from the differential amplifier 20 on the one hand and the output signal s from the DAC 11 marred by its added noise on the other hand. It carries out the difference operation between the two useful signals while deducting the compensation noise from the noise added by the DAC:

$$(g \cdot u_e + b_e) - (s + b_{DAC}) = (g \cdot u_e - s) + (b_e - b_{DAC}) \text{ with } b_{DAC} = \beta_{DAC} \cdot s$$

For example, the component 21 can include two differential pairs whose currents are summed pairwise in two cascodes.

The invention described above has the main advantage furthermore that the amplitude noise is attenuated as if it had been generated at the loop output and not in the loop return, that is to say as if it had been generated by the ADC whose defects are corrected by the loop and therefore as if no noise had been introduced by the loop return DAC.

The invention claimed is:

1. A closed loop slaving device for slaving a first component in a closed loop, an output of the first component forming an output of the closed loop, the slaving device comprising a second component having a multiplicative noise ($\beta_{DAC}$), wherein the closed loop comprises:
    a first combiner having: a first input forming a loop input, an input signal to the closed loop provided at the loop input; a second input to provide a compensation noise; and an output;
    a second combiner having a first input in communication with the output of the first combiner, and an output of the second combiner in communication with an input of the first component; and
    a loop return, an input of the loop return formed from the output of the closed loop, the input of the loop return in communication with an input of the second component, an output of the second component forming an output of the loop return, and the output of the loop return in communication with a second input of the second combiner,
    wherein:
    the compensation noise signal being substantially equal to the input signal of the closed loop multiplied by the multiplicative noise of the second component.

2. The closed loop slaving device as claimed in claim 1, wherein:
    the compensation noise signal is dependent on a reference voltage of a current source which supplies a current to the second component; and
    the multiplicative noise of the second component is dependent on the reference voltage of the current source.

3. The closed loop slaving device as claimed in claim 1, further comprising a differential amplifier which generates the compensation noise, the differential amplifier receiving as input:
    the input signal to the closed loop; and
    a reference voltage dependent upon the current to the second component.

4. A sigma-delta modulator to convert an analog input signal into a digital output signal, comprising:
    a first combiner having: a first input forming a sigma-delta modulator input, an input signal to the sigma-delta modulator provided at the sigma-delta modulator input; a second input to provide a compensation noise signal; and an output;

a second combiner having a first input in communication with the output of the first combiner;

an amplifier having an input in communication with an output of the second combiner;

an analog-to-digital converter having an input in communication with an output of the amplifier, and the analog-to-digital converter having an output to provide the digital output signal;

a digital-to-analog converter having an input formed from the digital output signal, and an output in communication with a second input of the second combiner, the analog-to-digital converter further having a multiplicative noise, wherein:

the compensation noise signal being substantially equal to the input signal of the sigma-delta modulator multiplied by the multiplicative noise of the digital-to-analog converter.

5. The sigma-delta modulator as claimed in claim 4, wherein the first combiner includes an analog summator that injects the input signal and the compensation noise signal into the sigma-delta modulator.

6. The sigma-delta modulator as claimed in claim 4, further comprising a differential amplifier which generates the compensation noise, the differential amplifier receiving as input:

the input signal to the sigma-delta modulator; and a reference voltage dependent upon the current to the digital-to-analog converter.

7. The sigma-delta modulator as claimed in claim 6, wherein the input signal and the compensation noise are injected into the sigma-delta modulator by summation of the currents of the differential amplifier in branches of a cascode of the digital-to-analog converter.

* * * * *